United States Patent [19]

Pedder

[11] Patent Number: 5,406,210

[45] Date of Patent: Apr. 11, 1995

[54] APPARATUS AND METHOD FOR TESTING BARE DIES WITH LOW CONTACT RESISTANCE BETWEEN THE DIE AND TESTING STATION

[75] Inventor: David J. Pedder, Long Compton, United Kingdom

[73] Assignee: GEC-Marconi Limited, United Kingdom

[21] Appl. No.: 12,998

[22] Filed: Feb. 3, 1993

[30] Foreign Application Priority Data

Feb. 7, 1992 [GB] United Kingdom ............... 9202560

[51] Int. Cl.$^6$ ............................................. G01R 1/04
[52] U.S. Cl. .................................. 324/757; 324/758
[58] Field of Search ..................... 29/832; 324/158 P

[56] References Cited

U.S. PATENT DOCUMENTS

| 4,426,773 | 1/1984 | Hargis | 324/51 |
| 4,585,991 | 4/1986 | Reid et al. | 324/158 P |
| 4,975,637 | 12/1990 | Frankeny et al. | 324/158 F |

FOREIGN PATENT DOCUMENTS

| 0131375 | 1/1985 | European Pat. Off. |
| 0304868 | 3/1989 | European Pat. Off. |
| 0350609 | 1/1990 | European Pat. Off. |
| 2246662 | 2/1992 | United Kingdom |
| WO8911659 | 11/1989 | WIPO |
| WO9112706 | 8/1991 | WIPO |

*Primary Examiner*—Kenneth A. Wieder
*Assistant Examiner*—Barry C. Bowser
*Attorney, Agent, or Firm*—Kirschstein

[57] ABSTRACT

A bare die testing apparatus comprising a multilayer interconnection structure 10 having a testing station 11 for testing the bare die 20, testing circuits and components 12 arranged in said structure adjacent the testing station 11, said testing station 11 having a plurality of microbumps 17 of conductive material soldered onto wettable metallization pads 18 located on interconnection trace terminations of the interconnection structure, said terminations being connected through the interconnections of the multilayer structure to said testing circuits and components 12. The microbumps 17 are distributed in a pattern corresponding to the pattern of contact pads 19 on a bare die 20 to be tested. A method of testing bare dies by the bare-die testing apparatus embodying the invention, the method including optically aligning the contact pads 19 of a bare die 20 under test with the microbumps 17 of the testing station 11, contacting the aligned contact pads 19 of the bare die 20 with the corresponding microbumps 17 of the testing station 11 and applying appropriate pressure on to bare die 20 to ensure desired low contact resiststance between the microbumps 17 and the contact pads 14.

7 Claims, 1 Drawing Sheet

BONDS FROM MCM-D TO pcb

CONTACT FORCE

APPARATUS AND METHOD FOR TESTING BARE DIES WITH LOW CONTACT RESISTANCE BETWEEN THE DIE AND TESTING STATION

BACKGROUND OF THE INVENTION

The invention relates to an apparatus and method for testing bare dies.

A classical problem in the assembly of any hybrid circuit, comprising a number of unpackaged integrated circuit (IC) devices to be assembled on an appropriate circuit interconnection substrate, is connected with the fact that the probability that each chip in the assembly is actually functional is less than unity. The yield of the assembled hybrid is then the product of all the individual chip yield probabilities and the assembly yield, or, expressed mathematically:

$$Y = (F \cdot (B)^m)^n$$

where Y = final circuit yield
Y = final circuit yield
F = probability that an IC is functional
B = probability of forming individual IC to substrate connection
m = number of connections per chip
n = number of ICs in the circuit assembly In order to obtain high circuit yield, it is essential that every IC is functional prior to committing it to the assembly and that a very high yield assembly process is employed. The flip chip solder bonding technique, for example, in which an array of solder bumps are provided over the contact pads on the naked IC and the IC attached to the substrate in an inverted attitude, has been shown to provide an appropriately high yield assembly method. In uncooled IR detector arrays, for example, 100% bond yield has been obtained in devices with 10,000 solder bond connections, implying an individual bond yield of 99.99% or better.

Unfortunately-with the use of naked, unpackaged ICs, such as are employed in many forms of hybrid circuit construction, the individual IC probability of functionality is not as high as this. More typical figures are between 90% and 99%. This is largely due to the difficulty of testing bare, unpackaged ICs thoroughly, particularly at the final operating frequency, and also, in part, to the statistical nature of testing high complexity devices where the test patterns can only sample a portion of the device's functional requirements. This then means that, as the number of ICs in the assembly increase, the circuit yield will decrease and rapidly approach the point where it becomes unacceptably low.

There is therefore a clear requirement to devise an apparatus and method that ensure high individual IC functional confidence or device "goodness" for the assembly of bare die hybrid circuits.

Silicon integrated circuit devices (SICs) are processed in wafer form and initial device testing is conducted on the completed wafer prior to dicing using a probe card or, more recently, a membrane probe card, to make electrical contacts to the contact pads of the ICs under test. A conventional probe card comprises a radial array of metallic probes supported in a circular aperture on a printed circuit board. The probes are provided with fine probe tips, commonly fabricated using fine tungsten wire which has been formed to a spherical tip shape at the point of contact, with a typical tip diameter of 50 $\mu$m. These tungsten probes are typically 0.5 mm in length and 0.15 mm diameter. Contact forces of 6 to 8 grams per probe are employed to ensure that low contact resistance to the aluminium alloy metallisation pads on the IC is obtained. A probe set is expected to provide some 0.5 million touch downs before replacement. The probes are independently mounted and adjusted to ensure consistent contact. Tungsten is selected as the probe material since it provides high hardness for a low probe wear rate and low electrical resistivity for low probe resistance.

Device tests on wafer include basic parametric tests, low frequency functional testing and, in some cases, speed binning tests using specially designed test structures, or boundary scan testing. The relatively high resistance and particularly the inductance of the conventional probe card arrangement, however, precludes thorough device testing at full operating frequency. A further constraint on wafer level testing is associated with the finite test time required to conduct a comprehensive functional test. The mechanical difficulties associated with constricting conventional probe cards for very high pin count ICs is one reason that alternative probe card approaches are now being examined.

Once the ICs that have passed the wafer level probe testing have been packaged, then comprehensive functional testing can proceed. The package provides mechanical protection for the IC, to allow straightforward device handling in the test system feeder, and also a practical means of making contact to the device under test through the package leads.

SUMMARY OF THE INVENTION

According to this invention there is provided a bare die testing apparatus comprising a multilayer interconnection structure having a testing station for testing the bare die, testing circuits and components arranged in said structure adjacent the testing station, said testing station having a plurality of microbumps of conductive material soldered onto wettable metallization pads located on interconnect ion trace terminations of the interconnection structure, said terminations being connected through the interconnections of the multilayer structure to said testing circuits and components, said microbumps being distributed to a pattern corresponding to the pattern of contact pads on a bare die to be tested.

Further according to the invention there is provided a method of testing a bare die by the bare-die testing apparatus of the present invention, the method including optically aligning the contact pads of a bare die under test with the microbumps of the testing station, contacting the aligned contact pads of the bare die with the corresponding microbumps of the testing station and applying appropriate pressure on to the bare die to ensure desired low contact resistance between the microbumps and the contact pads.

Preferably, the multilayer interconnection structure is formed by a thin film technology and includes a ground plane, a power plane and at least one layer for signal trace routing. The multilayer structure may be a multilayer aluminium-polymide metallisation structure formed on a silicon substrate.

Preferably the microbumps of the testing station are micro-spheres of copper or copper alloy plated with nickel or gold, the micro-sphere being soldered and self-aligned to said wettable metallization pads.

Alternatively the microbumps of the testing station are plated or vapour deposited solder bumps of gold-tin eutectic composition, the reflow of the solder bumps providing a desired radius of curvature of the microbumps.

DETAILED DESCRIPTION OF THE PREFERRED EMBODIMENT

Figure 1:
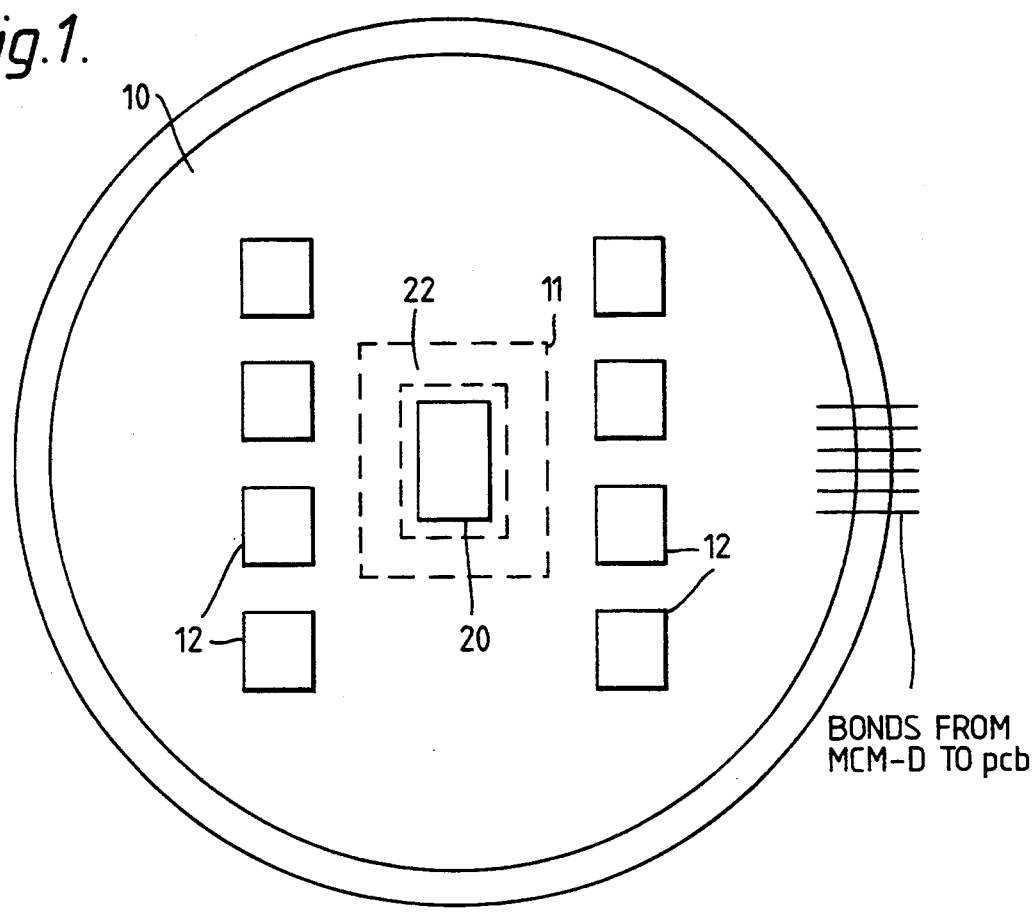
FIG. 1 illustrates a bare die testing apparatus embodying the invention.
Figure 2:
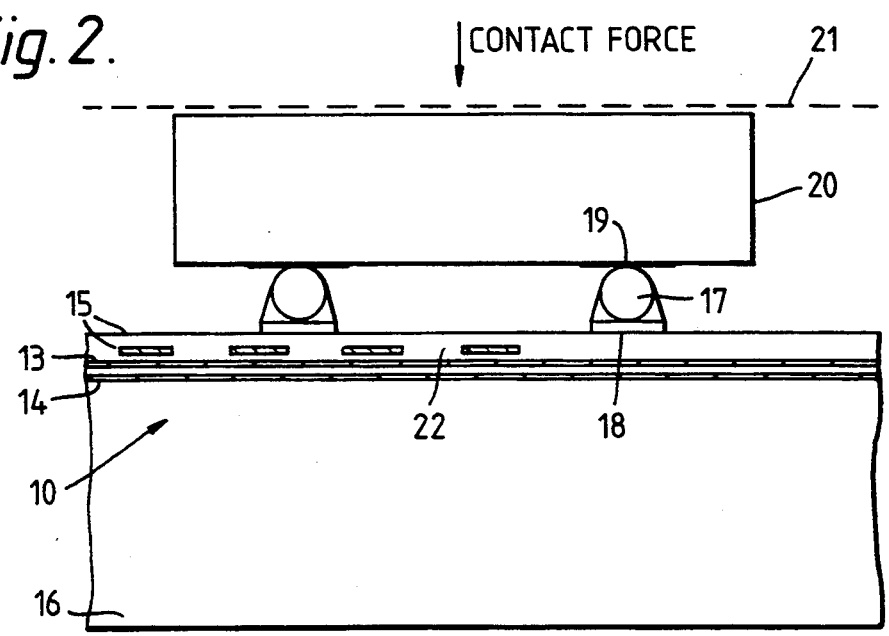
FIG. 2 illustrates a bare die (integrated circuit device under test) in contact with a testing station of the apparatus of FIG. 1.

Referring to FIGS. 1 and 2, the apparatus for testing, a bare die includes an MCM-D (Multichip Module which is deposited by a thin film technology) substrate 10 having a multilayer interconnection structure which includes a testing station 11 and a plurality of highspeed testing circuits and components such as local highspeed signal conditioning devices 12. The multilayer interconnection circuit 10 includes a ground plane 13, a power plane 14 and two signals layers 15 and is formed on a silicon substrate 16. The testing station 11 is a flip chip testing station having a plurality of microbumps 17 of conductive material soldered onto wettable metallisation pads 18 located on interconnection trace terminations of the interconnection structure 10, the termination of interconnection structure 10 being connected through the interconnection of the multilayer interconnection circuit to the testing circuit and components 12. The microbumps 17 of the testing station are distributed in a pattern corresponding to the pattern of contact pads 19 of a bare die such as IC device 20 under test. The device 20 to be tested is located above the testing station 11 with the active device surface facing the MCM-D test head substrate. The bare die is aligned with respect to the microbumps 17 on the MCM-D test head. Thereafter the device 20 is brought into contact with the test head and a required contact force is applied. After the test good dies are transferred to an appropriate waffle pack container, while failed die are rejected.

The apparatus embodying the invention uses an optical alignment method, for example an optical prism or semi-silvered mirror arrangement that allows simultaneous viewing of the die and substrate through solid state CCD camera or microscope optics, to accurately align the contact pads 19 of the device 20 over the microbumps 17 on the MCM-D substrate. In the case of the solid state CCD camera system, an optical probe is inserted between the die and the substrate which are separated in space, for the alignment step. After alignment, the optical probe is removed, the device is brought down onto the microbump contact points and appropriate contact pressure is applied to ensure low contact resistance. Such equipments also allow accurate autocollimation of the die and substrate surfaces to ensure parallelism and even application of the applied force over the microbumps contacts.

The microbumps 17 for use in the MCM-D test head are preferably, copper spheres soldered onto wettable metallisation pads 18 located on the interconnection trace terminations on the MCM-D substrate. These metallisation pads are lithographically defined to ensure exact (mirror image) matching of the soldered microbump contacts to the pads 19 of the device 20 to be tested, thus avoiding the alignment procedures required with conventional probe cards. A chromium-copper-gold multilayer metallisation, such as employed in the flip chip bonding, is a suitable solderable metal system. Other alternative systems may include titanium-platinum-gold or titanium-nickel-gold. Suitable solder compositions may include the Sn—Pb eutectic composition, 95 wt % Pb-5 wt% Sn solder or pure Sn, depending upon the temperature range desired for the test head. The solder surface tension forces act to centre the copper microspheres 17 over the wettable metallisation pads 18 and, given the correct solder volume, pull the microspheres into contact with the MCM-D trace termination pads. This will ensure that the microsphere "poles" (the final device contact points) are level to at least the size range of the original copper microspheres. A mechanical compression step, or a remelting of the microsphere assembly against an optically flat reference surface, may be employed to improve the microsphere levelling to ensure uniform contact to the device under test. It is anticipated that microsphere levelling to at least 0.1 $\mu$m accuracy will be required. The relatively low elastic modulus of an underlying polyimide dielectric 22 in the MCM-D substrate will provide some additional degree of compliance to improve the uniformity of contact to the device under test. A slight excess solder volume may be used to provide a thin, compliant solder layer over the copper microspheres to further improve contact to the device under test.

Copper microspheres of the required diameter may be produced by a number of methods One suitable method involves the atomisation of molten copper using established metallurgical techniques, followed by the sieving to select out a narrow size range of particles. The sphericity of the copper particle may then be improved by blending the copper into a bed of micron-sized alumina powder, so that each copper particle is separated from its neigh hours, and melting the copper in a reducing atmosphere at about 100° C. above the copper melting point. This process will allow the surface tension forces to operate to produce near perfect copper microspheres, whilst reducing any copper oxide contamination in the spheres. The fine alumina powder is not wetted by the molten copper, thus ensuring that the copper microspheres can be easily separated from the alumina packing after fusing, by a simple sieving operation. A further size classification may then be performed by use of a micrometer separator, with two rotating, gradually diverging rollers, or by a liquid sedimentation method. The sized copper microspheres would require electroless plating with nickel and gold to render them solderable and resistant to oxidation and tarnishing upon storage prior to soldering. The microspheres may be located over the wettable pads using a suitable patterned, etched metal foil mask and a vibratory dispensing procedure.

The heat treated pure copper microspheres will inevitably tend to be single crystals or to possess a grain size comparable to the sphere diameter, leading to a low yield stress and the possibility of poor wear resistance. It may prove necessary therefore to increase the copper yield strength by suitable alloying and heat treatment (using, for example, copper-beryllium alloys). Internal oxidation of the dilute copper alloy microspheres may also prove a very effective hardening technique that should lead to greatly enhanced wear resistance. This internal oxidation step could be conducted by packing and heat treating the spherodised microspheres in a "Rhines Pack", consisting of alumina powder, copper and cuprous oxide powders or by heat treatment in a suitable water/hydrogen or carbon dioxide/carbon monoxide gas mixture,, An alternative microbump contact structure, that may offer low contact resistance and suitable hardness for acceptable wear behaviour, comprises plated or vapour deposited solder bumps of gold-tin eutectic composition (80 wt.% Au-20 wt% Sn). The reflow of such bumps would provide a defined radius of curvature for the contact points, while the alloy hardness should prove sufficient to provide suitable wear resistance.

The MCM-D structure 10 provides high interconnection density, high bandwidth interconnections from the device under test, via the microbump contact points, to the test equipment circuitry. The MCM-D structure is constructed by thin film technologies (as indicated by the D qualification of the MCM technology type), for example with a multilayer aluminium-polyimide metallisation structure (as typical of a silicon MCM substrate), having four layers of interconnect; the ground plane 13, the power plane 14 and two layers 15 for signal trace routing. The track geometries on the silicon substrate 16 are between 10 and 25 micron line widths, with metal thicknesses of 2 to 5 microns at track pitches of 40 to 100 microns, while dielectric thicknesses are in the 5 to 20 micron range. Such geometries allow controlled impedance, 50 ohm lines to be defined if required. Alternative materials include copper as the conductive material and a range of alternative polymers, including BCB and PPQ. This interconnection technology geometry allows test access traces to be easily routed into the device under test area, while the low parasitics of the interconnection traces and the well defined tracer impedances provide high bandwidth. The power and ground plane structures provide high performance power and ground connections at the site of the device under test. Thin film resistor and capacitor components may be integrated into the MCM-D test head substrate as required, for example for line termination or for decoupling functions. The front end ICs and components of the test equipment, for example the signal conditioning circuitry components 12, are located on the MCM-D substrate adjacent to the device to be tested to provide a very high performance multichip module test head. As illustrated in FIG. 1, it is envisaged that the MCM-D test head would be provided with a protective cover, with a suitable aperture 22 to allow the device under test to be presented to the testing station, while the majority of the test head is protected from mechanical damage or contamination. A polymeric, "glob top" protection scheme may also be adopted to provide environmental protection for the test head and its circuitry.

A key aspect of this MCM-D test head concept is that the test head is stationary and the bare dies are transported, and presented to the test head, using the flip chip apparatus. While MCM-C (ceramic, co-fired MCM technology) and MCM-L (laminated or pcb-like MCM technology) could be employed in this test head structure, these MCM technology variants do not offer the: surface flatness or geometrical accuracy provided by the preferred MCM-D structure.

I claim:

1. A bare die testing apparatus, comprising: a multichip module (MCM) substrate having a multilayer interconnection structure including a testing station for testing a bare die; testing circuits and components mounted and interconnected on said substrate adjacent the testing station; said testing station having a plurality of micro-spheres of conductive material soldered and self-aligned onto wettable metallization pads located on interconnection trace terminations of the interconnection structure; said terminations being connected through the interconnections of the multilayer structure to said testing circuits and components; and said micro-spheres being distributed to a pattern corresponding to a pattern of contact pads on the bare die to be tested.

2. An apparatus as claimed in claim 1, in which the multilayer interconnection structure includes a ground plane, a power plane and at least one layer for signal trace routing.

3. An apparatus as claimed in claim 1, in which the multilayer structure is a multilayer aluminum-polyimide metallization structure formed on a silicon substrate.

4. An apparatus as claimed in claim 1, in which the micro-spheres are made of copper or copper alloy plated with nickel or gold.

5. An apparatus as claimed in claim 1, in which the micro-spheres of the testing station are plated or vapour deposited solder bumps of gold-tin eutectic composition, the reflow of the solder bumps providing a desired radius of curvature of the microspheres.

6. An apparatus as claimed in claim 1, including resistors and capacitors integrated into said MCM substrate.

7. A method of testing bare dies by a bare die testing apparatus including a multichip module (MCM) substrate having a multilayer interconnection structure including a testing station for testing a bare die; testing circuits and components mounted and interconnected on said substrate adjacent the testing station; said testing station having a plurality of micro-spheres of conductive material soldered and self-aligned onto wettable metallization pads located on interconnection trace terminations of the interconnection structure; said terminations being connected through the interconnections of the multilayer structure to said testing circuits and components; said micro-spheres being distributed to a pattern corresponding to a pattern of contact pads on the bare die to be tested, the method comprising the step of: optically aligning the contact pads of the bare die under test with the micro-spheres of the testing station; contacting the aligned contact pads of the bare die with the corresponding micro-spheres of the testing station; and applying appropriate pressure on to the bare die to ensure desired low contact resistance between the micro-spheres and the contact pads.

* * * * *